(12) United States Patent
Lee (10) Patent No.: US 6,838,298 B2
(45) Date of Patent: Jan. 4, 2005

(54) METHOD OF MANUFACTURING IMAGE SENSOR FOR REDUCING DARK CURRENT

(75) Inventor: Ju-Il Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/290,837

(22) Filed: Nov. 8, 2002

(65) Prior Publication Data

US 2003/0096438 A1 May 22, 2003

(30) Foreign Application Priority Data

Nov. 16, 2001 (KR) ........................................ 2001-71454

(51) Int. Cl.⁷ .............................................. H01L 21/00
(52) U.S. Cl. .............................. 438/29; 438/75; 438/73; 438/69; 438/57
(58) Field of Search ........................... 438/29, 57, 60, 438/69, 70, 73, 75

(56) References Cited

U.S. PATENT DOCUMENTS

| | | | |
|---|---|---|---|
| 5,546,375 A | * | 8/1996 | Shimada et al. ............ 369/126 |
| 6,249,330 B1 | * | 6/2001 | Yamaji ....................... 349/122 |
| 6,468,826 B1 | * | 10/2002 | Murakami et al. ............ 438/48 |
| 6,475,836 B1 | * | 11/2002 | Suzawa et al. ............. 438/149 |
| 2001/0023086 A1 | * | 9/2001 | Park et al. .................... 438/57 |

FOREIGN PATENT DOCUMENTS

| | | |
|---|---|---|
| KR | 1993-22569 | 11/1993 |
| KR | 2001-0061489 | 7/2001 |

OTHER PUBLICATIONS

Notice of Preliminary Rejection Issued to Korean Patent Application 2001–71454 (Aug. 30, 2003), with with English Translation, total 3 pages.

Wuu et al., "*High Performance 0.25–μm CMOS Color Imager Technology with Non–silicide Source/Drain Pixel*", IDEM pps. 705–708; 2000.

* cited by examiner

*Primary Examiner*—Michael Trinh
(74) *Attorney, Agent, or Firm*—Marshall,Gerstein & Borun LLP (57) ABSTRACT

A method capable of removing dangling bonds generated on a surface of a photodiode is disclosed herein. The method includes steps of providing a semiconductor substrate having a light sensing area and removing dangling bonds at a surface of the light sensing area by diffusing hydrogen ions to the surface of the light sensing area.

14 Claims, 9 Drawing Sheets

METHOD OF MANUFACTURING IMAGE SENSOR FOR REDUCING DARK CURRENT

BACKGROUND

1. Field of the Invention

The invention relates to a method for manufacturing a semiconductor device. More particularly, the invention relates to a method for manufacturing a complementary metal oxide semiconductor (CMOS) image sensor.

2. Brief Description of Related Technology

Generally, in a charge couple device (CCD) or a complementary metal oxide semiconductor (CMOS) image sensor, a light sensing area (e.g., a photodiode (PD)), converts incident light in accordance with each wavelength into an electric signal. In an ideal case, the quantum efficiency is 1 for all wavelengths of light; that is, all the incident light gathered in the photodiode is converted into electric signal.

Figure 1:
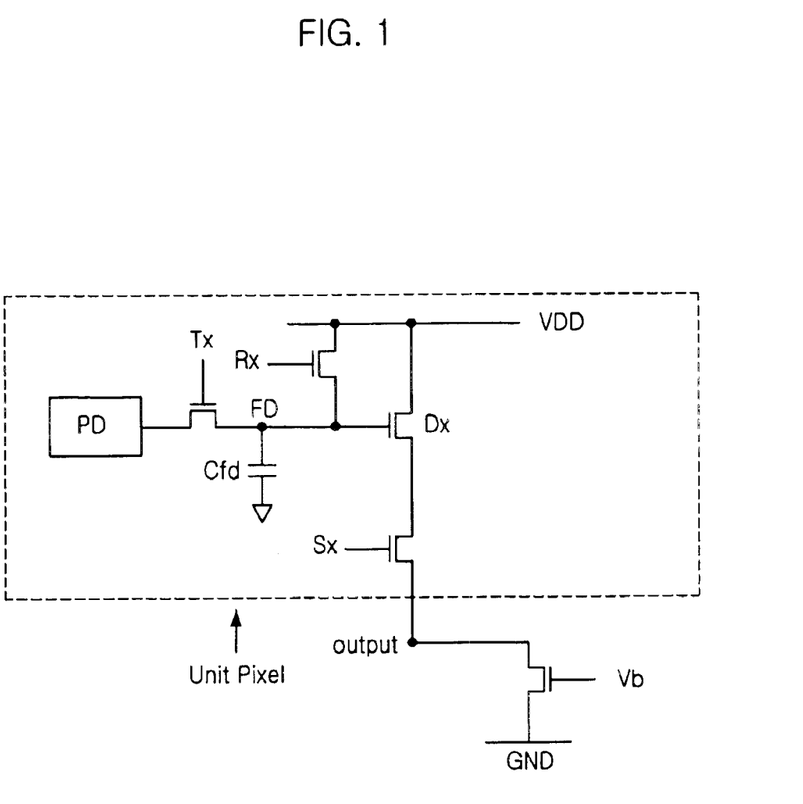
FIG. 1 is an equivalent circuit diagram illustrating general unit pixel of a complementary metal oxide semiconductor (CMOS) image sensor.

FIG. 1 is an equivalent circuit diagram of a general CMOS image sensor unit pixel. Referring to FIG. 1, the equivalent circuit includes one photodiode (PD) and four n-channel metal oxide semiconductors (NMOS) transistors, including a transfer transistor (Tx), a reset transistor (Rx), a drive transistor (Dx) and a select transistor (Sx). Outside of the unit pixel (UP) there is formed a load transistor (Vb) capable of reading an output signal. A floating diffusion node (FD) (also referred to as a floating sensing node) where an electric charge transferred from a photodiode (PD) is formed in a same common node of the transfer transistor Tx and the reset transistor Rx.

Figure 2:
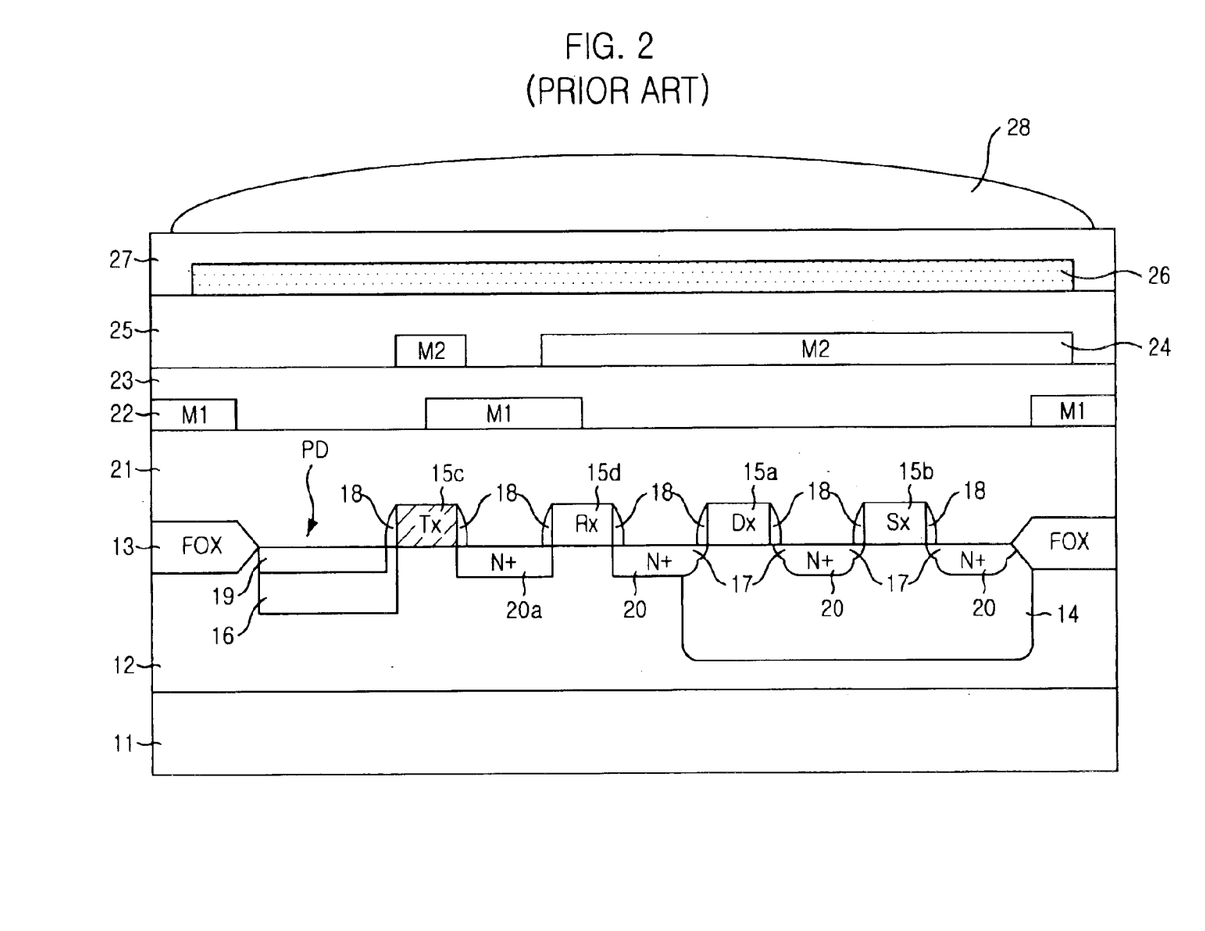
FIG. 2 is a cross-sectional view showing a conventional CMOS image sensor.

FIG. 2 is a cross-sectional view showing a conventional unit pixel of a CMOS image sensor such as that shown in FIG. 1.

A conventional method for manufacturing a CMOS image sensor will be described with reference to FIG. 2. First, a p-epitaxial layer 12 is grown on a $p^+$-substrate 11. Herein, the $p^+$-substrate 11 is doped with a high concentration of p-type dopant and the p-epitaxial layer 12 is doped with a low concentration of p-type dopant. After growing the p-epitaxial layer 12, a field oxide (FOX) layer 13 for separating unit pixels is formed in a predetermined region of the p-epitaxial layer 12 by using a local oxidation of silicon (LOCOS) method.

Thereafter, a p-well 14 is formed in a predetermined region of the p-epitaxial layer 12 by lateral diffusion of the p-type dopant caused by thermal treatment. On the p-well 14, gates of a drive transistor (Dx) and a select transistor (Sx) are to be formed.

A gate electrode 15a and a gate electrode 15b of the drive transistor (Dx) and the select transistor (Sx), respectively, are formed on the p-well 14. A gate electrode 15c and a gate electrode 15d of the transfer transistor (Tx) and the reset transistor (Rx), respectively, are formed on the p-epitaxial layer 12. In prior art devices, each of the four gate electrodes 15a, 15b, 15c, and 15d is formed of a polycide comprising a polysilicon layer and a tungsten silicide layer.

Subsequently, a low concentration of n-type dopant ($n^-$) is injected into the p-epitaxial layer 12 around one side of the gate electrode 15c of the transfer transistor (Tx) with high energy to form a $n^-$-diffusion layer 16.

Thereafter, an ion injection process is carried out to form lightly doped drains (LDD) 17 of each of the drive transistor (Dx) and the select transistor (Sx). Then, after depositing an insulating layer on the substrate, the insulating layer is etched without an etch mask to form a spacer 18 on each side of each of the four gate electrodes 15a, 15b, 15c, and 15d.

Next, a concentration of p-type dopant ($p^o$) is injected without an ion implantation mask, to form a $p^o$-diffusion layer 19 at the surface of the p-epitaxial layer 12. At this time, the $p^o$-diffusion layer 19 contacted to the $n^-$-diffusion layer 16 is spaced apart from the gate of the transfer transistor (Tx) as much as the width of the spacer 18.

A shallow PN connection including the $p^o$-diffusion layer 19 and the $n^-$-diffusion layer 16, and a PNP-type photodiode including the p-epitaxial layer 12, the $n^-$-diffusion layer 16, and the $p^o$-diffusion layer 19 are formed as a result of the above-described processes.

Subsequently, an ion injection process for forming source/drain regions 20 and floating sensing node (FD) 20a is carried out. That is, a floating sensing node (FD) 20a, which is common node (FD) of the reset transistor (Rx) and the transfer transistor (Tx), and source/drain regions 20 of the drive transistor (Dx), the selective transistor (Sx), and the reset transistor (Rx) are formed. The drive transistor (Dx) and the select transistor are general MOS transistors, and the select transistor (Sx) and the transfer transistor (Tx) are native NMOS transistors.

Next, a pre-metal dielectric (PMD) layer 21 is deposited on the substrate, and then the PMD layer is flattened. The majority of the PMD layer 21 is formed of oxide. After forming the PMD layer, a metal contact hole(not shown) and a first metal wiring (M1, 22) are formed, then an inter-metal-dielectric (IMD) layer 23 is formed on the first metal wiring 22.

Thereafter, a second metal wiring (M2, 24) is formed on the IMD layer 23, and a protection layer 25 is formed on the substrate including the second metal wiring 22 to complete a general process for forming a CMOS logic region. In prior art devices, an oxide layer is usually used as the protection layer 25, and the first metal wiring 22 and the second metal wiring 24 are not overlapped with the photodiode (PD) for the transmission of incident light toward the photodiode (PD).

After completing formation of the above-described CMOS logic region, three color filters 26 are formed to achieve a color image, and an overcoating layer 27 is formed for flatting a resulting structure formed on the substrate 11. Finally, a microlens 28 is formed to increase a light concentration.

However, in the above-described conventional method for forming a CMOS logic region, dangling bonds (DB) are generated on a surface of the $p^o$-diffusion layer 19 within a photodiode (PD) region, because a plurality of etching processes are carried out to form the field insulation layer 13 by the LOCOS process to form the gate electrodes, and to form the ion implantation mask.

Figure 3:
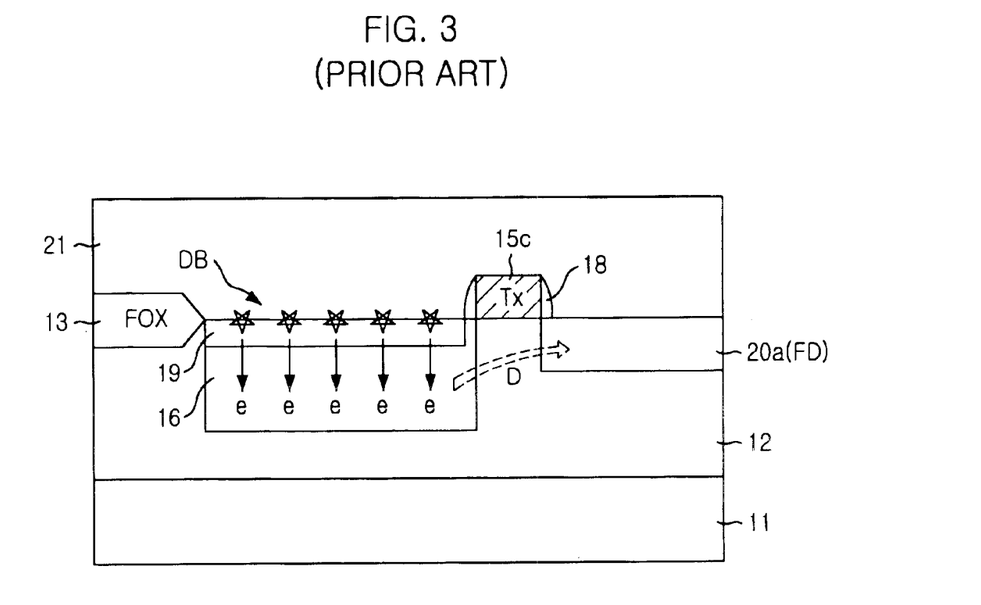
FIG. 3 is a cross-sectional view showing dark current generation in a conventional image sensor.

In a boundary of the $p^o$-diffusion layer 19 formed of silicon and the PMD layer 21 formed of oxide layer, a stable condition is maintained when one silicon atom is combined with two oxygen atoms. However, as shown in FIG. 3, due to a plurality of etching processes, such as etching of a field oxide layer, a gate electrode, ion implantation mask, and so on, the surface of the $p^o$-diffusion layer 19 is damaged and dangling bonds (DB) of (—Si—O) or (—Si—) are generated.

Therefore, electrons (e) are generated due to the dangling bonds (DB) at the surface of the $p^o$-diffusion layer 19 and are stored in the $n^-$-diffusion layer 16, whereby a dark current (D) flows from a photodiode (PD) to a floating sensing node (FD) 20a, even though light is not incident. In other words, only in case of a light incidence should electrons be generated and stored in a depletion layer ($n^-$-diffusion layer 16) of a photodiode, and then moved to flow a current. However, the dangling bonds (—Si—O or —Si—) on the surface of the p°-diffusion layer 19 are in a condition of easily generating electric charges in thermal treatment even though light is not incident, so if a plurality the dangling bonds (DB) exist, an image sensor shows an irregular reaction as if light is incident, even in a dark situation.

Moreover, in the conventional method, as shown in FIG. 2, the protection layer 25 is formed only as an oxide layer, therefore, it is impossible to remove the dangling bonds and to suppress the excessive generation of the dark current. Accordingly, the picture quality of an image sensor is deteriorated by the dark current to the floating sensing node (FD).

SUMMARY

It is, therefore, desirable to provide a method of manufacturing an image sensor capable of preventing picture quality deterioration caused by a dark current.

Accordingly, disclosed herein is a method of manufacturing an image sensor, including the steps of: providing a semiconductor substrate comprising a light sensing area; and removing dangling bonds at a surface of the light sensing area by diffusing hydrogen ions to the surface of the light sensing area. The removing step can include the steps of: forming a protection layer on the semiconductor substrate having the light sensing area, wherein the protection layer contains hydrogen ions therein; and performing a thermal treatment in an atmosphere of hydrogen to diffuse the hydrogen ions from the protection layer into the surface of the light sensing area.

Also disclosed herein is a method of manufacturing an image sensor, including the steps of: forming a photodiode in a semiconductor substrate; forming a transfer transistor, a reset transistor, a drive transistor, and a select transistor on the semiconductor substrate; forming an interlayer insulating layer on the semiconductor substrate; forming a protection layer on the interlayer insulating layer, wherein the protection layer contains hydrogen ions therein; and diffusing hydrogen ions from the protection layer into a boundary of the photodiode and the interlayer insulating layer.

Also disclosed herein is a method of manufacturing an image sensor, including the steps of: forming a photodiode in a semiconductor substrate; forming a transfer transistor, a reset transistor, a drive transistor, and a select transistor on the semiconductor substrate; forming an interlayer insulating layer on the semiconductor substrate; forming a protection layer on the interlayer insulating layer; forming a sacrificial layer, wherein the sacrificial layer contains hydrogen ions therein; diffusing hydrogen ions in the protection layer into a boundary of the photodiode and the interlayer insulating layer; and removing the sacrificial layer.

BRIEF DESCRIPTION OF THE DRAWINGS

Other aspects of the disclosure will become apparent from the following description of the examples with reference to the accompanying drawings, in which.

DETAILED DESCRIPTION

Hereinafter, a method for manufacturing an image sensor for reducing dark current will be described in detail referring to the accompanying drawings.

Figure 4A:
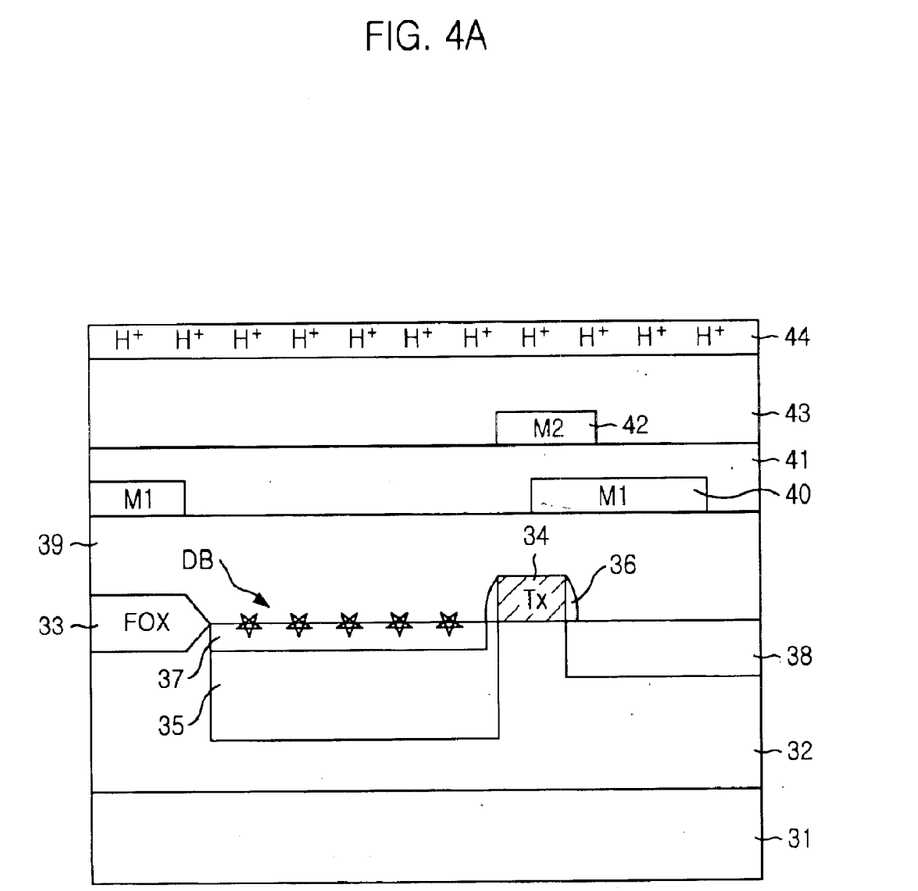
FIGS. 4A to 4C are cross-sectional views showing a method of manufacturing a CMOS image sensor in accordance with an example described herein.
Figure 4B:
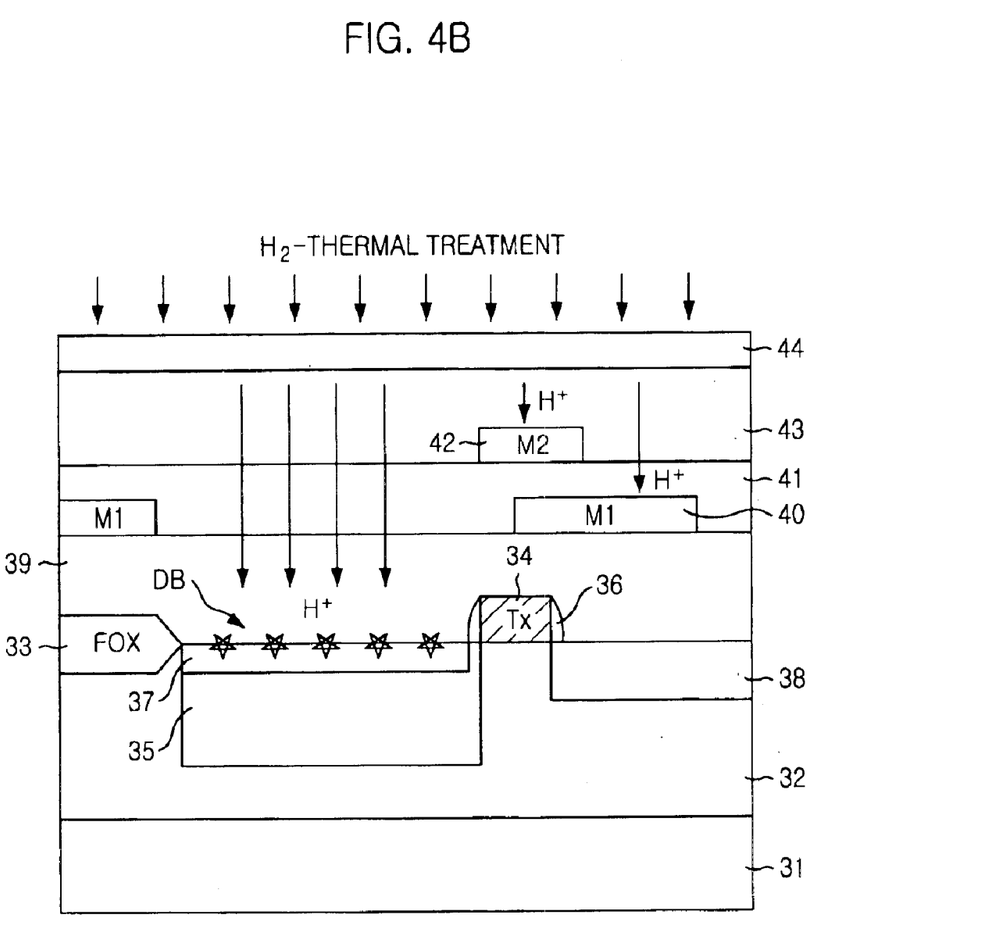
Figure 4C:
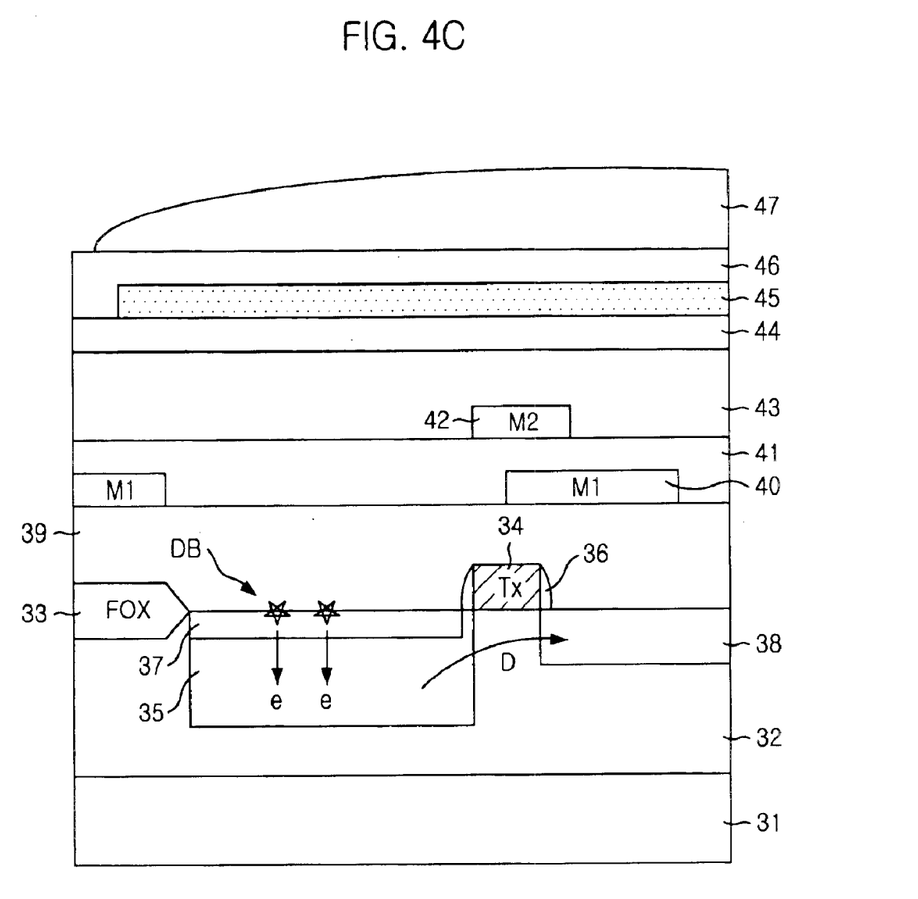

FIGS. 4A to 4C are cross-sectional views showing a method of manufacturing a complementary metal oxide semiconductor (CMOS) image sensor in accordance with an example described herein. In FIGS. 4A to 4C, a reset transistor, a drive transistor, and a select transistor are omitted.

Referring to FIG. 4A, a p-epitaxial layer 32 is grown on a $p^+$-substrate 31. Herein, the $p^+$-substrate 31 is doped with a high concentration of p-type dopant and the p-epitaxial layer 32 is doped with a low concentration of p-type dopant. After growing the p-epitaxial layer 32, a field oxide layer 33 for separating unit pixels is formed in a predetermined region of the p-epitaxial layer 32 by using a local oxidation of silicon (LOCOS) method.

Thereafter, a p-well (not shown) is formed in a predetermined region of the p epitaxial layer 32 with lateral diffusion of p-type dopant caused by thermal treatment. On the p-well, gates of a drive transistor (Dx) and a select transistor (Sx) are to be formed.

Thereafter, gate electrodes (not shown) of the drive transistor (Dx) and the select transistor (Sx), are formed on the p-well, and a gate electrode 34 of the transfer transistor (Tx) and a gate electrode (not shown) of the reset transistor (Rx) are formed on the p-epitaxial layer 32. Each of the four gate electrodes can be formed of a polycide including a polysilicon layer and a tungsten silicide layer.

Subsequently, a low concentration of n-type dopant ($n^-$) is injected into the p-epitaxial layer 32 around one side of the gate electrode 34 of the transfer transistor (Tx) with high energy to form a $n^-$-diffusion layer 35.

Thereafter, an ion injection process is carried out to form lightly doped drains (LDD) (not shown) of each of the drive transistor (Dx) and the select transistor (Sx). Then, after depositing an insulating layer on the substrate 31, the insulating layer is etched without an etch mask to form a spacer 36 on each side of each of the four gate electrodes.

Next, a concentration of p-type dopant (p°) is injected without an ion implantation mask, to form a p°-diffusion layer 37 at the surface of the p-epitaxial layer 32. The p°-diffusion layer 37 contacted to the $n^-$-diffusion layer 35 is spaced apart from the gate of the transfer transistor (Tx) as much as the width of the spacer 36.

A shallow PN connection including the p°-diffusion layer 37 and the if n-diffusion layer 35; and a PNP-type photodiode including the $p^-$-epitaxial layer 32, the $n^-$-diffusion layer 35, and the p°-diffusion layer 37 are formed by the above-described processes. Subsequently, an ion injection process for forming source/drain regions and a floating sensing mode is carried out. That is, a floating sensing node 38, which is common node of the reset transistor (Rx) and the transfer transistor (Tx), and source/drains (not shown) of the drive transistor (Dx), the selective transistor (Sx) and the reset transistor (Rx) are formed. The drive transistor (Dx) and the select transistor (Sx) are general MOS transistors, and the select transistor (Sx) and the transfer transistor (Tx) are native NMOS transistors.

Subsequently, a pre-metal dielectric (PMD) layer 39 is deposited on the substrate 31, and then the PMD layer 39 is flattened. The PMD layer 39 includes more than 50% of an oxide such as tetraethyl orthosilicate (TEOS) or borophosphosilicate glass (BPSG). After forming the PMD layer 39, a metal contact hole (not shown) and a first metal wiring (M1, 40) are formed, then an inter-metal-dielectric (IMD) layer 41 is formed on the first metal wiring 41 and the PMD layer 39.

Thereafter, a second metal wiring (M2, 42) is formed on the IMD layer 41, and a protection layer is formed on the substrate 31 including the second metal wiring 42 to complete a general process for forming a CMOS logic region. The protection layer includes an oxide layer 43 and a silicon-oxy-nitride ($SiO_xN_y$) layer 44 which contains a plurality of hydrogen ions. The layer 44 is formed of a mixed gas of $SiH_4$ and $N_2O$ to a thickness of about 2000 Å to about 10000 Å. The refractive index (RI) of the $SiO_xN_y$ layer 44 can be as low as about 1.66, so there is no need to perform an additional process for removing the $SiO_xN_y$ layer.

A reaction between a reaction gas $NH_3$ and the mixed source gases of $SiH_4$ and $N_2O$ for forming the $SiO_xN_y$ layer is denoted in Eq. 1:

$$SiH_4 + N_2O + NH_3 \rightarrow SiO_xN_y + N_2\uparrow + H_2O\uparrow + H^+. \quad [Eq. 1]$$

With the reaction shown in Eq. 1, the $SiO_xN_y$ layer 44 is formed, and volatile $N_2$ gas and hydrogen are produced. One portion of the hydrogen reacts with oxygen to form $H_2O$ gas and another portion remains in the $SiO_xN_y$ layer 44 as a $H^+$ ion state.

In the step of forming the protection layer including the oxide layer 43 and the $SiO_xN_y$ layer 44, dangling bonds (DB) are also generated on a surface of the p°-diffusion layer 37 of a photodiode, as in a conventional method.

Referring to FIG. 4B, the oxide layer 43 and the $SiO_xN_y$ layer 44 undergo thermal treatment at a temperature of about 400° C. to about 500° C. in an atmosphere of hydrogen. At this time, hydrogen ions $H^+$ in the $SiO_xN_y$ layer 44 penetrate into the oxide layer 43, the IMD layer 41, and the PMD layer 39, and the hydrogen ions $H^+$ diffuse toward the surface of the p°-diffusion layer 37 of the photodiode region.

Meanwhile, some of the hydrogen ions $H^+$, e.g., those diffusing to a region outside of the photodiode, are blocked by the first metal wiring 40 and the second metal wiring 42.

The hydrogen ions can be sufficiently diffused by carrying out thermal treatment at a temperature of 400° C. to 500° C. If the thermal treatment is carried out at low temperature, e.g., below 400° C., then the diffusion effect of the hydrogen ions may be decreased, and if the thermal treatment is carried out at a high temperature, e.g., over 500° C., then the characteristic of metal wiring can be deteriorated by the diffusion of hydrogen ions. Therefore, it is preferred to perform the thermal treatment at a temperature of about 400° C. to 500° C.

Referring to FIG. 4C, three color filters 45 are formed to achieve a color image, and an over coating layer 46 is formed for flattening a resulting structure formed on the substrate 31. Finally, a microlens 47 is formed to increase the light concentration.

By practice of a method disclosed herein, the amount of the dangling bonds generated at the boundary of the p°-diffusion layer 37 and the PMD layer 39, namely at the boundary of a silicon layer and an oxide layer, can be reduced, even though many dangling bonds DB are generated on the surface of the p°-diffusion layer 37 during a plurality of etching processes. That is, the number of dangling bonds can be reduced by forming a part of the protection layer with a $SiO_xN_y$ layer 44 containing many hydrogen ions and by diffusing the hydrogen ions to the surface of the p°-diffusion layer 37 to combine with the dangling bonds during the thermal treatment performed in a hydrogen atmosphere. In other words, a hydrogen ion is combined with a dangling bond, such as (—Si—O) or (—Si—), at the boundary of the silicon layer and the oxide layer. Therefore, it is possible to prevent a dark current from flowing to the floating sensing node 38, to the utmost.

Figure 5A:
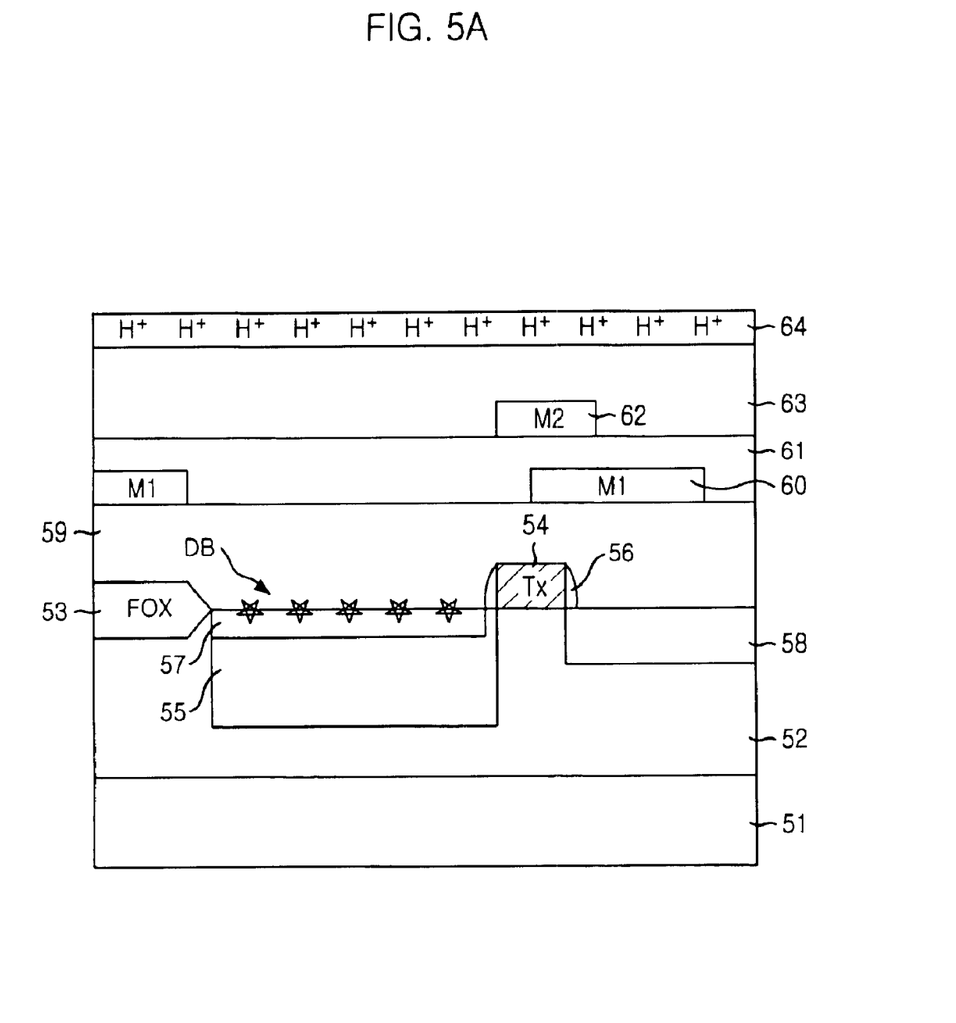
FIGS. 5A to 5C are cross-sectional views showing a method of manufacturing a CMOS image sensor in accordance with an example described herein.
Figure 5B:
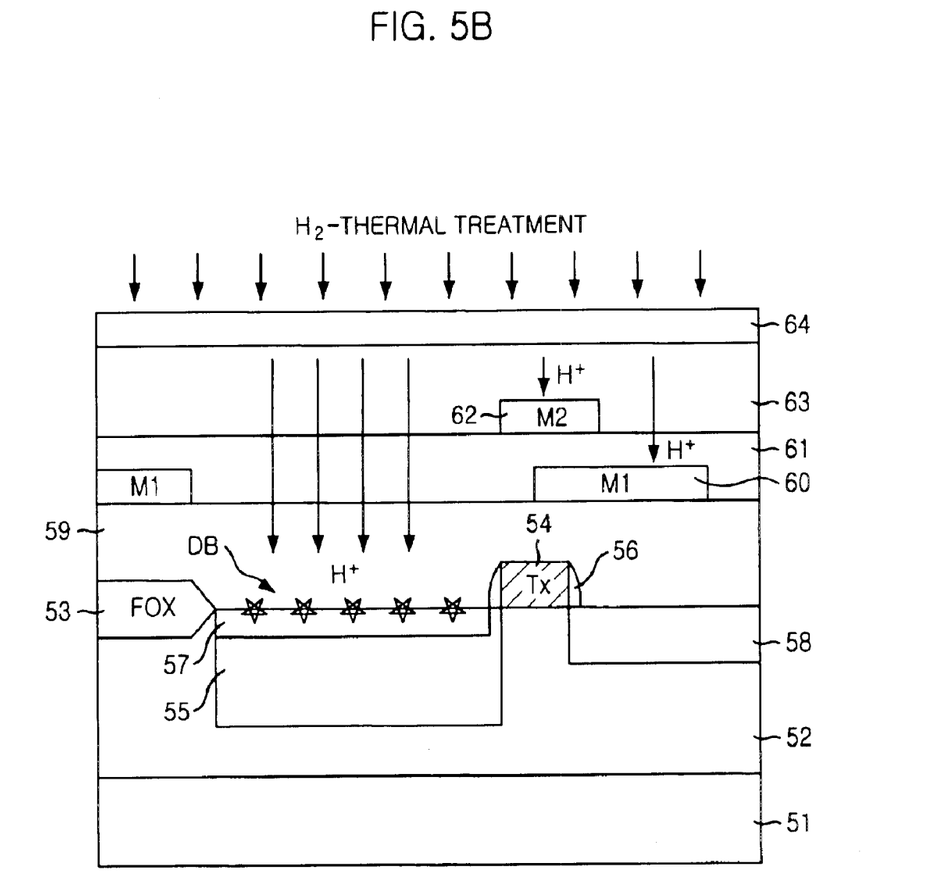
Figure 5C:
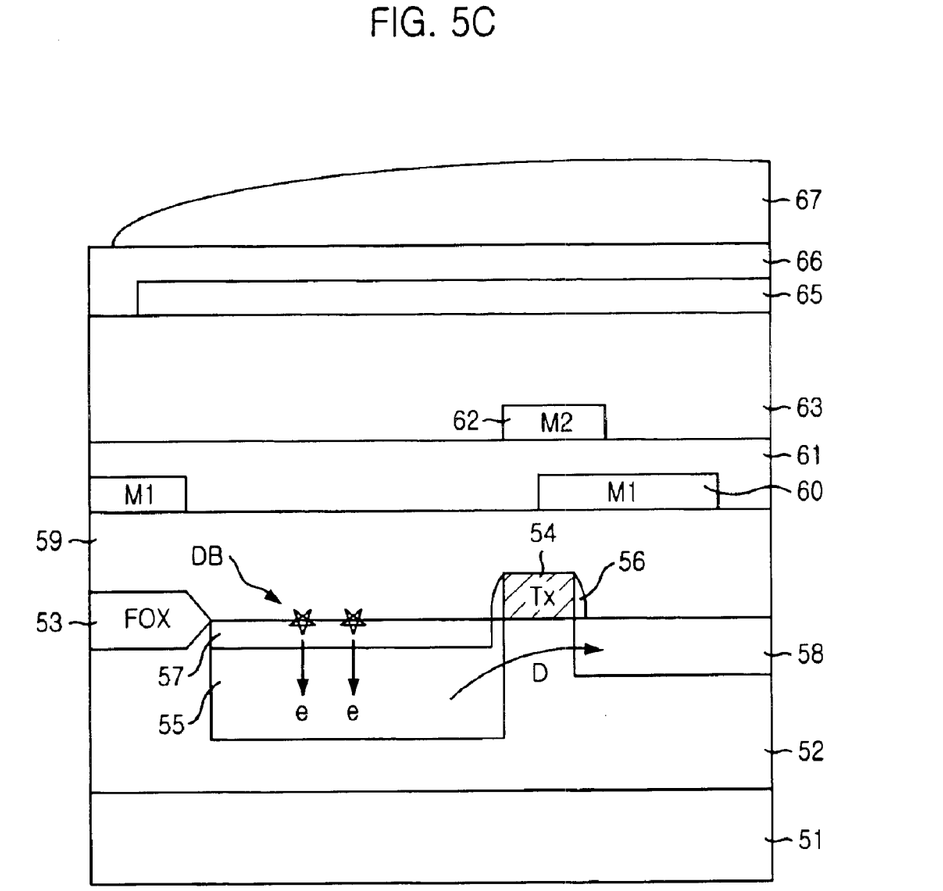

FIGS. 5A to 5C are cross-sectional views showing a method of manufacturing a complementary metal oxide semiconductor (CMOS) image sensor in accordance with another example described herein. In FIGS. 5A to 5C, only a photodiode, a transfer transistor and a floating sensing node are denoted (i.e., a reset transistor, a drive transistor, and a select transistor are omitted).

Referring to FIG. 5A, a p-epitaxial layer 52 is grown on a $p^+$-substrate 51. Herein, the $p^+$-substrate 51 is doped with a high concentration of p-type dopant and the p-epitaxial layer 52 is doped with a low concentration of p-type dopant. After growing the p-epitaxial layer 52, a field oxide layer 53 for separating unit pixels is formed in a predetermined region of the p-epitaxial layer 52 by using a local oxidation of silicon (LOCOS) method.

Thereafter, a p-well (not shown) is formed in a predetermined region of the p-epitaxial layer 52 with lateral diffusion caused by thermal treatment. On the p-well, gates of a drive transistor (Dx) and a select transistor (Sx) are to be formed.

Thereafter, gate electrodes (not shown) of the drive transistor (Dx) and the select transistor (Sx) are formed on the p-well, and a gate electrode 54 of the transfer transistor (Tx) and a gate electrode (not shown) of reset transistor (Rx) are formed on the p-epitaxial layer 52. Each of the four gate electrodes can be formed of a polycide including a polysilicon layer and a tungsten silicide layer.

Subsequently, a low concentration of n-type dopant ($n^-$) is injected into the p-epitaxial layer 52 around one side of the gate electrode 54 of the transfer transistor (Tx) with high energy to form a $n^-$-diffusion layer 55.

Thereafter, an ion injection process is carried out to form lightly doped drains (LDD) (not shown) of each of the drive transistor (Dx) and the select transistor (Sx). After depositing an insulating layer on the substrate 51, the insulating layer is etched without an etch mask to form a spacer 56 on each side of each of the four gate electrodes.

Next, p-type dopants (p°) are injected without an ion implantation mask, to form a p°-diffusion layer 57 at the surface of the p-epitaxial layer 52. At this time, the p°-diffusion layer 57 contacted to the $n^-$-diffusion layer 55 is spaced apart from the gate of the transfer transistor (Tx) as much as the width of the spacer 56.

A shallow PN connection including the p°-diffusion layer 57 and the $n^-$-diffusion layer 55; and a PNP-type photodiode including the p-epitaxial layer 52, the $n^-$-diffusion layer 55, and the p°-diffusion layer 57 are formed by the above-mentioned processes. Subsequently, an ion injection process for forming source/drain regions and a floating sensing mode is carried out. That is, a floating sensing node 58, which is common node of the reset transistor (Rx) and the transfer transistor (Tx), and source/drains (not shown) of the drive transistor (Dx) the selective transistor (Sx), and the reset transistor (Rx) are formed. The drive transistor (Dx) and the select transistor (Sx) are general MOS transistors, and the select transistor (Sx) and the transfer transistor (Tx) are native NMOS transistors.

Subsequently, a pre-metal dielectric (PMD) layer 59 is deposited on the substrate 51, and then the PMD layer 59 is flattened. The PMD layer 59 includes at least 50% of an oxide such as tetraethyl orthosilicate (TEOS) or borophosphosilicate glass (BPSG). After forming the PMD layer 59, a metal contact hole (not shown) and a first metal wiring (M1, 60) are formed, then an inter-metal-dielectric (IMD) layer 61 is formed on the first metal wiring 61 and the PMD layer 59.

Thereafter, a second metal wiring (M2, 62) is formed on the IMD layer 61, and a protection layer is formed on the substrate 61 including the second metal wiring 62 to complete a general process for forming a CMOS logic region. The protection layer includes an oxide layer 63 (i.e., a first protection sublayer) and a silicon-nitride ($Si_3N_4$) layer 64 (i.e., a second protection sublayer) which contains a plurality of hydrogen ions. The layer 64 is formed of a mixed gas of $SiH_4$ to a thickness of about 2000 Å to about 10000 Å.

A reaction between a reaction gas $NH_3$ and the source gas $SiH_4$ for forming the $Si_3N_4$ layer is denoted in Eq. 2:

$$3SiH_4 + 4NH_3 \rightarrow Si_3N_4 + xH_2\uparrow(24-2x)H^+ \quad [Eq. 2]$$

With the reaction shown in Eq. 2, the $Si_3N_4$ layer 64 is formed, and hydrogen is produced. One portion of the hydrogen forms an $H_2$ gas to be pumped out and another portion remains in the $Si_3N_4$ layer 64 as a $H^+$ ion state.

In the step of forming the protection layer including the oxide layer 63 and the $Si_3N_4$ layer 64, dangling bonds (DB) are also generated on a surface of the p°-diffusion layer 57 of a photodiode, as in a conventional method.

Referring to FIG. 5B, the oxide layer 63 and the $Si_3N_4$ layer 64 undergo thermal treatment at a temperature of 400° C. to 500° C. in an atmosphere of hydrogen. At this time, hydrogen ions $H^+$ in the $Si_3N_4$ layer 64 penetrate into the oxide layer 63, the IMD layer 61, and the PMD layer 59, and the hydrogen ions $H^+$ diffuse toward the surface of the p°-diffusion layer 57 of the photodiode region.

Meanwhile, some of the hydrogen ions $H^+$, e.g., those diffusing to a region outside of the photodiode, are blocked by the first metal wiring 60 and the second metal wiring 62. The hydrogen ions can be sufficiently diffused by carrying out a thermal treatment at a temperature of 400° C. to 500° C. If the thermal treatment is carried out at a low temperature, e.g., below 400° C., then the diffusion effect of the hydrogen ions may be decreased, and if the thermal treatment is carried out at a high temperature, e.g., over 500° C., then the characteristic of metal wiring can be deteriorated by the diffusion of hydrogen ions. Therefore, it is proper to perform the thermal treatment at a temperature of 400° C. to 500° C.

Referring to FIG. 5C, after removing the $Si_3N_4$ layer 64 with a wet or dry etch, three color filters 65 are formed to achieve a color image, and an over coating layer 66 is formed for flattening the resulting structure formed on the substrate 61. Finally, a microlens 67 is formed to increase the light concentration. The refractive index (RI) of the $Si_3N_4$ layer 64 is about 2.1 which is higher than that of an oxide layer having RI of about 1.46, for example, a $SiO_xN_y$ layer having RI of about 1.66, so light penetration decreases excessively. That is, if the $Si_3N_4$ layer 64 is not removed, then light penetration and light sensitivity may be reduced. Therefore, it is preferable to perform a process for removing the $Si_3N_4$ layer.

By practice of a method disclosed herein, the amount of the dangling bond generated at the boundary of the p°-diffusion layer 57 and the PMD layer 59, namely at the boundary of a silicon layer and an oxide layer, can be reduced, even though many dangling bonds are generated on the surface of the p°-diffusion layer 57 during a plurality of etching processes. That is, the number of dangling bonds can be reduced by forming a part of the protection layer with a $Si_3N_4$ layer 64 containing many hydrogen ions and by diffusing the hydrogen ions to the surface of the p°-diffusion layer 57 to combine with the dangling bonds during the thermal treatment performed in a hydrogen atmosphere. In other words, a hydrogen ion is combined with a dangling bond, such as (—Si—O) or (—Si—), at the boundary of the silicon layer and the oxide layer. Therefore, it is possible to prevent a dark current from flowing to the floating sensing node 58, to the utmost.

The generation of the dark current can be reduced or prevented by a method according to the disclosure, so the picture quality of an image sensor can be increased. In addition, a yield decrease caused by a dark current can be prevented and, therefore, it is possible to increase the yield. Moreover, the methods described herein can contribute to experiments for developing a dead zone characteristic which has a trade-off with the dark current generation, and, therefore, it is possible to increase the characteristic of an image sensor in a low illumination condition.

The methods described herein can be used to reduce or eliminate dark current in various image sensors, such as charge coupled devices (CCD), active pixel sensors, and the like.

Although the examples of the disclosure have been described for illustrative purposes, those skilled in the art will appreciate that various modifications, additions and substitutions are possible, without departing from the scope and spirit of the disclosure.

What is claimed is:

1. A method of manufacturing an image sensor, comprising the steps of:
   forming a photodiode in a semiconductor substrate;
   forming a transfer transistor, a reset transistor, a drive transistor, and a select transistor on the semiconductor substrate;
   forming an interlayer insulating layer on the semiconductor substrate;
   forming a first protection sublayer, in which a metal wiring is formed, on the interlayer insulating layer;
   forming a second protection sublayer on the first protection sublayer; and
   diffusing hydrogen ions in the second protection layer into a boundary of the photodiode and the insulating layer.

2. The method of claim 1, wherein the step of forming the protection layer includes the steps of:
   forming a first protection layer on the interlayer insulating layer, wherein the first protection layer is formed of a material having a refractive index capable of penetrating an incident light; and
   forming a second protection layer on the first protection layer, wherein the second protection layer contains the hydrogen ions therein, and wherein the second protection layer is formed of a material having a refractive index capable of penetrating an incident light.

3. The method of claim 2, wherein the first protection sublayer comprises an oxide, and the second protection sublayer comprises $SiO_xN_y$.

4. The method of claim 3, wherein the $SiO_xN_y$ layer is formed by a reaction of a $SiH_4$ gas and $N_2O$ gas.

5. The method of claim 2, wherein a thermal treatment is carried out at a temperature of 400° C. to 500° C. in an ambient of hydrogen for diffusing hydrogen ions.

6. The method of claim 2, wherein a thermal treatment is carried out at a temperature of 400° C. to 500° C.

7. A method of manufacturing an image sensor, comprising the steps of:

forming a photodiode in a semiconductor substrate;

forming a transfer transistor, a reset transistor, a drive transistor, and a select transistor on the semiconductor substrate;

forming an interlayer insulating layer on the semiconductor substrate;

forming a protection layer, in which a metal wiring is formed, over the interlayer insulating layer;

forming a sacrificial layer containing hydrogen ions therein over the protection layer;

diffusing hydrogen ions in the sacrificial layer into a boundary of the photodiode and the interlayer insulating layer; and removing the sacrificial layer.

8. The method of claim 7, wherein the sacrificial layer formed of a source gas including $SiH_4$.

9. The method of claim 7, wherein a thermal treatment is carried out at a temperature of 400° C. to 500° C. in an ambient of hydrogen for diffusing hydrogen ions.

10. The method of claim 7, wherein the sacrificial layer is removed by a dry etch process or a wet etch process.

11. The method of claim 7, wherein the protection layer comprises an oxide and the sacrificial layer comprises a silicon nitride.

12. A method of manufacturing an image sensor, comprising the steps of:

forming a photodiode in a semiconductor substrate;

forming a transfer transistor, a reset transistor, a drive transistor, and a select transistor on the semiconductor substrate;

forming a first interlayer insulating layer on the semiconductor substrate;

forming a second interlayer insulating layer, in which a metal wiring is formed, on the first interlayer insulating layer;

forming a first protecting layer on the second interlayer insulating layer;

forming a second protecting layer containing hydrogen ions on the first protecting layer; and performing a thermal treatment at an atmosphere of a hydrogen gas to diffuse the hydrogen ions into a boundary of the photodiode and the first interlayer insulating layer.

13. The method of claim 12, wherein the first protecting layer includes an oxide layer, and the second protection layer includes $SiO_xN_y$ layer.

14. The method of claim 13, wherein the $SiO_xN_y$ layer is formed by a reaction of a $SiH_4$ gas and $N_2O$ gas.

* * * * *